United States Patent
Lu et al.

(10) Patent No.: US 11,234,327 B1
(45) Date of Patent: Jan. 25, 2022

(54) PRINTED CIRCUIT BOARD TRACE FOR GALVANIC EFFECT REDUCTION

(71) Applicant: Western Digital Technologies, Inc., San Jose, CA (US)

(72) Inventors: Songtao Lu, Shang Hai (CN); Cheng-Hsiung Yang, Hsinghu (TW); Yuequan Shi, Shang Hai (CN); Ye Bai, Shang Hai (CN); Chih-Chin Liao, Thanghua (TW); JinXiang Huang, Shang Hai (CN)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 17/214,215

(22) Filed: Mar. 26, 2021

(51) Int. Cl.
*H05K 1/02* (2006.01)
*H05K 3/00* (2006.01)

(52) U.S. Cl.
CPC .......... *H05K 1/025* (2013.01); *H05K 3/0073* (2013.01); *H05K 2201/0287* (2013.01); *H05K 2201/09227* (2013.01); *H05K 2201/10621* (2013.01)

(58) Field of Classification Search
CPC ......... H05K 1/025–0253; H05K 3/0072–0082
See application file for complete search history.

(56) References Cited

U.S. PATENT DOCUMENTS

| | | | |
|---|---|---|---|
| 2008/0102653 A1* | 5/2008 | Adulami | H05K 1/117 439/59 |
| 2011/0003487 A1* | 1/2011 | Xiang | H01R 13/193 439/59 |

* cited by examiner

*Primary Examiner* — Jeremy C Norris
(74) *Attorney, Agent, or Firm* — Michael Best & Friedrich LLP

(57) ABSTRACT

Devices and methods are described for reducing etching due to galvanic effect within a printed circuit board that may be used, for example, in a data storage device, such as a card-type data storage device. Specifically, a contact trace is coupled to a contact finger that has a substantially larger surface area than the contact trance, and that is configured to couple the data storage device to a host device. The contact trace is electrically isolated from the rest of the circuitry during a fabrication process. The contact finger and an exposed portion of the contact trace are plated with a common material to reduce galvanic etching of the contact trace during fabrication. The contact trace is then connected to an impedance trace though at least one of a component and a bond wire.

20 Claims, 10 Drawing Sheets

PRINTED CIRCUIT BOARD TRACE FOR GALVANIC EFFECT REDUCTION

BACKGROUND

This application relates generally to printed circuit boards, and more particularly, to a configuration of traces and connections within a printed circuit board that are configured to reduce the Galvanic effect between traces and connections that include different metallic materials.

Printed circuit boards or substrates are used to provide electrical connections between electronic components, such as integrated circuit dies and passive components and other components mounted on the PCB or substrate, as well as external electrical connections to the components mounted on the PCB. Some memory devices, such as hybrid flip chip products used in card type applications (for example, SD cards, microSD cards, USB cards, and the like) are cleaned using a cleaning chemical prior to a finish being applied to the metal components on the substrate (for example, Organic Solder-ability Preservatives ("OSP")). Further, the general structure of a hybrid flip chip product features a metallic finger that provides a connection to a host device and is constructed of a first material. The host device also has an associated internal connection or trace constructed of a second, different metallic material. The cleaning chemical, combined with the metallic finger having a much larger surface area of metal as opposed to the internal connection points that are electrically connected to the metallic finger results in a voltage differential between the metallic finger and the associated internal connection point due to the galvanic effect. This voltage differential can result in over etching of the internal connection point, causing potential weakening or increased resistance of the internal connection points or traces.

SUMMARY

Etching of traces in a data storage device during a cleaning process can require traces to be oversized for a given application to account for potential etching. By controlling the amount of etching due to the galvanic effect, the width and thickness of traces within the data storage device can be better controlled, allowing for trace impedances to be accurately determined and maintained.

One embodiment of the present disclosure includes a data storage device, which include a substrate having a first side and a second side opposite to the first side, and a contact finger disposed on the first side of the substrate configured to interface with a host device. The data storage device further includes a contact trace coupled to the contact finger that extends from the first side of the substrate to the second side of the substrate, wherein the contact trace has an exposed portion disposed on the second side of the substrate. The data storage device further includes an impedance trace disposed on the second side of the substrate and configured to be coupled to one or more memory components of the data storage device. The contact finger and the exposed portion of the contact trace are plated with a common material to reduce galvanic etching of the first contact trace, and the exposed portion of the contact trace is electrically connected to the impedance trace though at least one of a component and a bond wire.

In another embodiment of the present disclosure, a method for reducing etching due to galvanic effect in a data storage device is described which includes determining a ratio of a surface area of a contact finger to a surface area of an exposed portion of a contact trace electrically connected to the contact finger, wherein the contact finger is configured to provide an electronic connection to a host device. The method further includes determining whether the ratio exceeds a predetermined threshold, and, responsive to determining that the ratio exceeds the predetermined threshold, separating the exposed portion of the contact trace into a contact trace portion and an impedance trace. The contact trace portion and the impedance trace are electrically isolated. The method further includes plating the contact finger and the contact trace portion with a common material, and electrically connecting the contact trace portion and the impedance trace with a component.

In one embodiment of the of the present disclosure, a card-type data storage device is provided, including a substrate having a first side and a second side opposite the first side, and a contact finger disposed on the first side of the substrate configured to interface with a host device and plated with a plating material. The card-type data storage device further includes a first trace coupled to the first contact finger and extending from the first side of the substrate to the second side of the substrate. The first trace has an exposed portion disposed on the second side of the substrate, the exposed portion being plated with the plating material. The card-type data storage device also includes a second trace disposed on the second side of the substrate, wherein a portion of the second trace is plated with the plating material. The exposed portion of the first trace is electrically connected to the second trace through a connection device. The connection device is connected between the plated portion of the first trace and the plated portion of the second trace.

Various aspects of the present disclosure provide for improvements in memory devices. For example, reducing etching due to galvanic effect reduces impedance variation in traces, and allows for more precise trace design. The present disclosure can be embodied in various forms. The foregoing summary is intended solely to give a general idea of various aspects of the present disclosure and does not limit the scope of the present disclosure in any way.

DETAILED DESCRIPTION

In the following description, numerous details are set forth, such as data storage device configurations, and the like, in order to provide an understanding of one or more aspects of the present disclosure. It will be readily apparent to one skilled in the art that these specific details are merely exemplary and not intended to limit the scope of this application. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, etc. Those of skill in the art also will realize that although the disclosure refers to a substrate used in a data storage device, the disclosure may apply to substrates used in other types of electronic devices. The disclosure applies to both substrates and printed circuit boards used in electronic devices.

Figure 1:
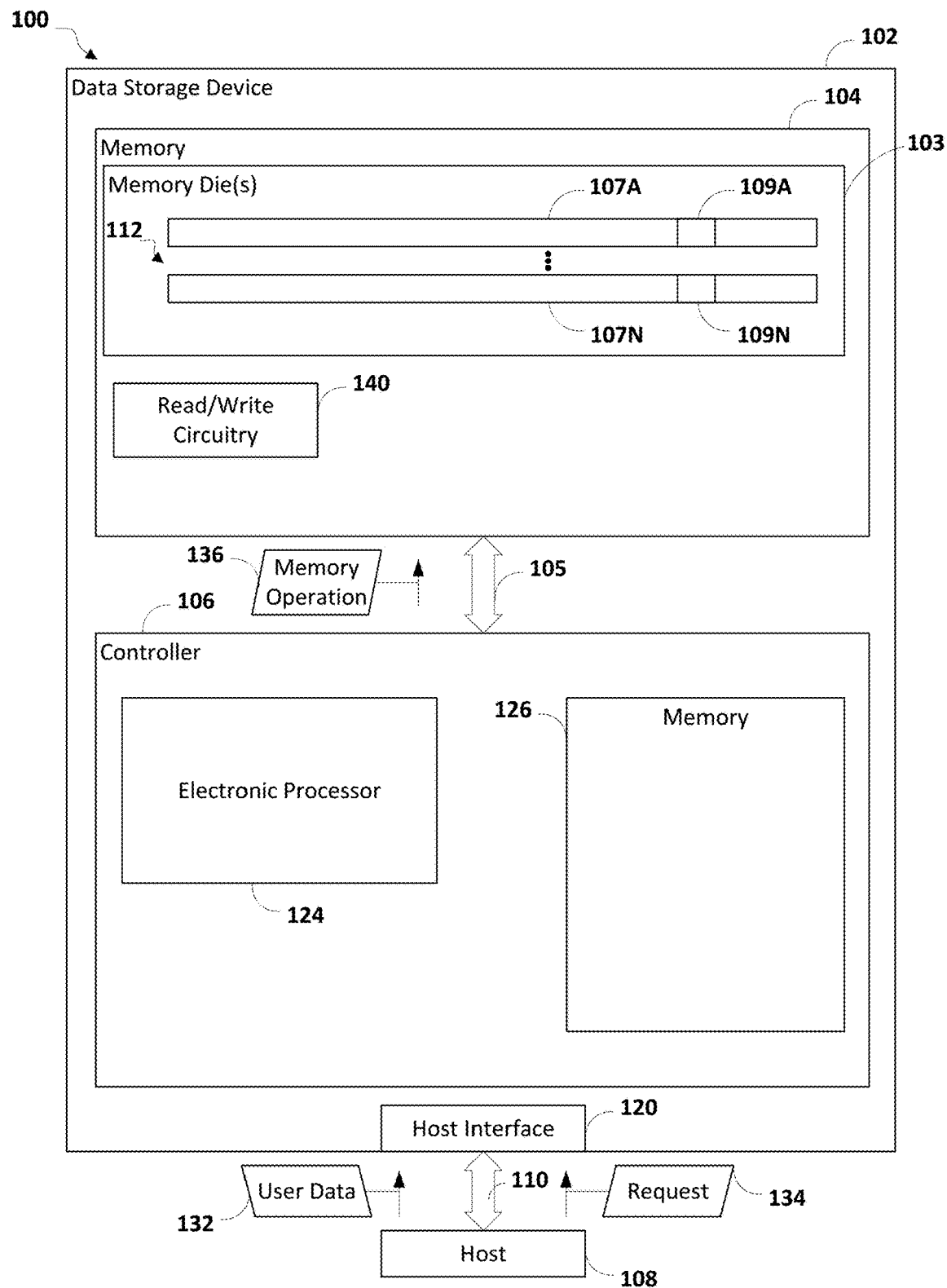
FIG. 1 is block diagram of one example of a system including a data storage device, according to some embodiments.

FIG. 1 is a block diagram of one example of a system 100 that includes a data storage device 102 in communication with a host device 108. The data storage device 102 includes a memory device 104 (e.g., non-volatile memory) that is coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled with a connection (e.g., a communication path 110), such as a bus or a wireless connection. In some examples, the data storage device 102 may be embedded within the host device 108. Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 108 with the communication path 110, such as a wired communication path and/or a wireless communication path. For example, the data storage device 102 may include an interface 120 (e.g., a host interface) that enables communication with the communication path 110 between the data storage device 102 and the host device 108, such as when the interface 120 is communicatively coupled to the host device 108. In some embodiments, the communication path 110 may include one or more electrical signal contact pads or fingers that provide electrical communication between the data storage device 102 and the host device 108.

The host device 108 may include a processor and a memory. The memory may be configured to store data and/or instructions that may be executable by the processor. The memory may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory device 104 of the data storage device 102. For example, the host device 108 may be configured to provide data, such as user data 132, to be stored at the memory device 104 or to request data 134 to be read from the memory device 104. The host device 108 may include a mobile smartphone, a music player, a video player, a gaming console, an electronic book reader, a personal digital assistant (PDA), a computer, such as a laptop computer or notebook computer, any combination thereof, or other suitable electronic device.

The host device 108 communicates with a memory interface that enables reading from the memory device 104 and writing to the memory device 104. In some examples, the host device 108 may operate in compliance with an industry specification, such as a Universal Flash Storage (UFS) Host Controller Interface specification. In other examples, the host device 108 may operate in compliance with one or more other specifications, such as a Secure Digital (SD) Host Controller specification or other suitable industry specification. The host device 108 may also communicate with the memory device 104 in accordance with any other suitable communication protocol.

The memory device 104 of the data storage device 102 may include a non-volatile memory (e.g., NAND, BiCS family of memories, or other suitable memory). In some examples, the memory device 104 may be any type of flash memory. For example, the memory device 104 may be two-dimensional (2D) memory or three-dimensional (3D) flash memory. The memory device 104 may include one or more memory dies 103. Each of the one or more memory dies 103 may include one or more memory blocks 112 (e.g., one or more erase blocks). Each memory block 112 may include one or more groups of storage elements, such as a representative group of storage elements 107A-107N. The group of storage elements 107A-107N may be configured as a wordline. The group of storage elements 107A-107N may include multiple storage elements (e.g., memory cells that are referred to herein as a "string"), such as a representative storage elements 109A and 109N, respectively.

The memory device 104 may include support circuitry, such as read/write circuitry 140 to support operation of the one or more memory dies 103. Although depicted as a single component, the read/write circuitry 140 may be divided into separate components of the memory device 104, such as read circuitry and write circuitry. The read/write circuitry 140 may be external to the one or more memory dies 103 of the memory device 104. Alternatively, one or more individual memory dies may include corresponding read/write circuitry that is operable to read from and/or write to storage elements within the individual memory die independent of any other read and/or write operations at any of the other memory dies.

The controller 106 is coupled to the memory device 104 (e.g., the one or more memory dies 103) with a bus 105, an interface (e.g., interface circuitry), another structure, or a combination thereof. For example, the bus 105 may include multiple distinct channels to enable the controller 106 to communicate with each of the one or more memory dies 103 in parallel with, and independently of, communication with the other memory dies 103.

The controller 106 is configured to receive data and instructions from the host device 108 and to send data to the host device 108. For example, the controller 106 may send data to the host device 108 using the interface 120, and the controller 106 may receive data from the host device 108 with the interface 120. The controller 106 is configured to send data and commands (e.g., the memory operation 136, which may be a cycle operation of a memory block of the memory device 104) to the memory device 104 and to receive data from the memory device 104. For example, the controller 106 is configured to send data and a program or write command to cause the memory device 104 to store data to a specified address of the memory device 104. The write command may specify a physical address of a portion of the memory device 104 (e.g., a physical address of a word line of the memory device 104) that is to store the data.

The controller 106 is configured to send a read command to the memory device 104 to access data from a specified address of the memory device 104. The read command may specify the physical address of a region of the memory device 104 (e.g., a physical address of a word line of the memory device 104). The controller 106 may also be configured to send data and commands to the memory device 104 associated with background scanning operations, garbage collection operations, and/or wear-leveling operations, or other suitable memory operations.

The controller 106 may include a processor 124, a memory 126, and other associated circuitry. The memory 126 may be configured to store data and/or instructions that may be executable by the processor 124.

The controller 106 may send the memory operation 136 (e.g., a read command) to the memory device 104 to cause the read/write circuitry 140 to sense data stored in a storage element. For example, the controller 106 may send the read command to the memory device 104 in response to receiving a request for read access from the host device 108. In response to receiving the read command, the memory device 104 may sense the storage element 107A (e.g., using the read/write circuitry 140) to generate one or more sets of bits representing the stored data.

Figure 2:
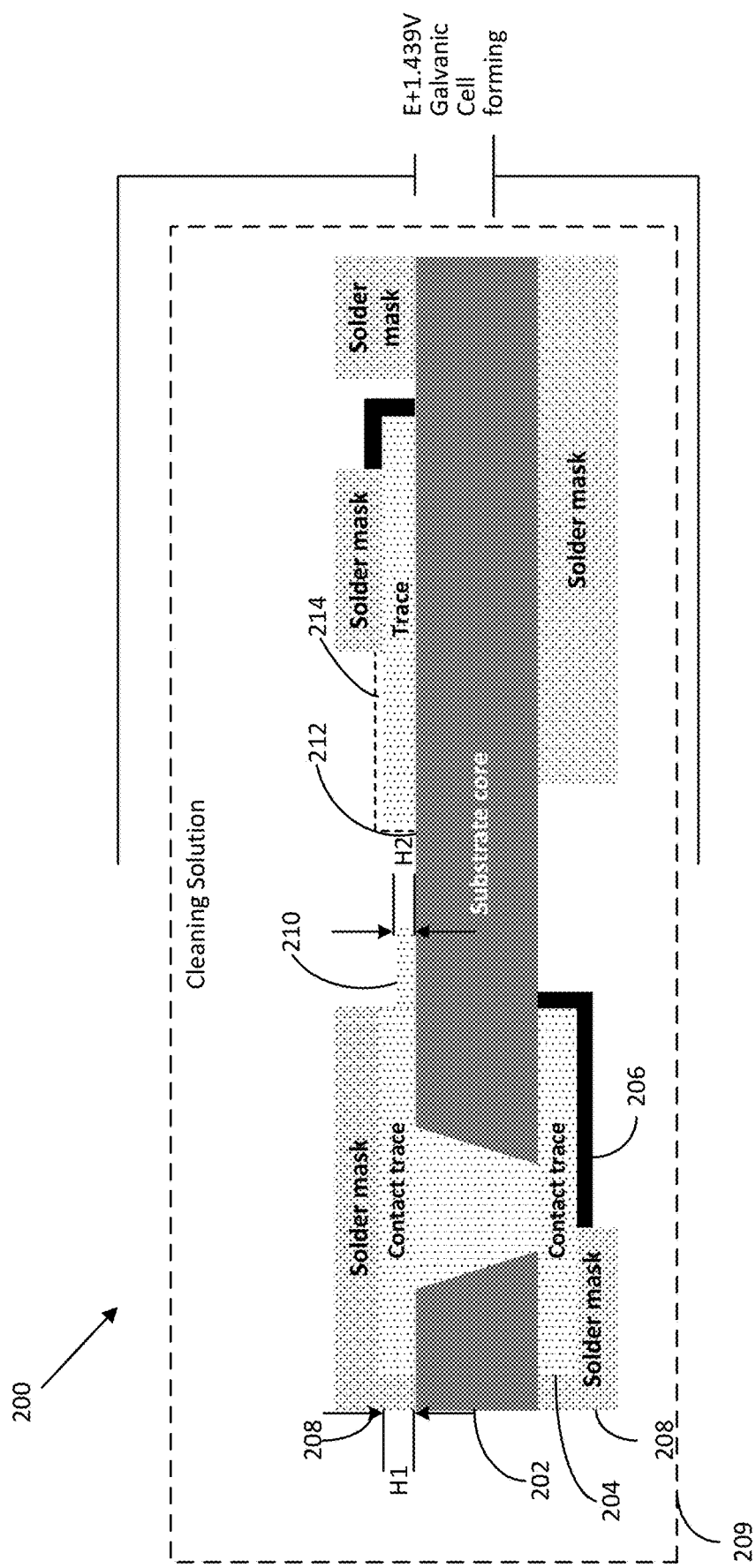
FIG. 2 is a cross-sectional view of a portion of a substrate used in a data storage device, according to some embodiments.

Turning now to FIG. 2, a cross-sectional view of a general substrate or circuit board 200 used in a data storage device, such as data storage device 102, is provided. The circuit board 200 includes a substrate core 202, a contact finger trace 204, and a contact finger area 206. The contact finger area 206 is configured to provide an electrical connection between the data storage device 102 and a host device, such as host device 108. The contact finger trace 204 is further configured to couple one or more components of the data storage device 102 to the contact finger area 206. Generally, the contact finger trace 204 is constructed of copper ("Cu"); however, other material types are contemplated. Further, during the manufacturing process, the contact finger area 206 is plated with a different material than the contact finger trace 204. In one example, the contact finger area 206 is plated with gold ("Au"). In another example, the contact finger area 206 is plated with a nickel-gold compound. In other examples, other materials may be used as appropriate for a given application.

A solder mask 208 is applied to other portions of the contact finger trace 204 as well during the fabrication process. The solder mask 208 prevents unwanted solder connections from being made to the contact finger trace 204, and also seals portions of the contact finger trace 204 from various solvents or other treatments applied to the data storage device 102, as described in more detail below.

During the manufacturing process a solvent or other cleaning solution 209 is applied to the circuit board 200 prior to a coating being applied to the circuit board. Example coatings may include an organic solderability preservative ("OSP"), which is one or more water-based organic compounds that selectively bond to trace material (e.g., copper) and protects the trace material until soldering is performed. An example cleaning solution 209 may be a Piranha solution or Piranha etch, which is generally a mixture of sulfuric acid ("$H_2SO_4$"), water ("$H_2O$"), and hydrogen peroxide ("$H_2O_2$"). The cleaning solution 209 may be used to clean organic residue from the circuit board 200.

A byproduct of applying the cleaning solution 209 to the circuit board 200 is generally known to be the formation of a galvanic cell due to the different metallic materials used in the contact finger trace 204 and the contact finger area 206 (e.g., copper and gold), which is known as galvanic effect. The cleaning solution 209 acts as a conducting element to allow a redox reaction to occur between the dissimilar metals, wherein the metals lose electrons resulting in a voltage being generated. The contact finger trace 204 includes an exposed trace portion 210 which is generally constructed of copper and has a much smaller area than the contact finger area 206, which is generally constructed of gold. As shown in FIG. 2, a voltage difference of approximately 1.439V is developed between the contact finger area 206 and the exposed trace portion 210. However, voltages of more than 1.439V and less than 1.439V may be generated based on the types of materials used for the exposed trace portion 210 and the contact finger area 206, as well as the difference in exposed surface area between the exposed trace portion 210 and the contact finger area 206. In some examples, a current density of a galvanic cell may be used to determine an etching rate or speed. The current density is based on the ratio of different materials within a trace. This voltage differential results in the exposed trace portion 210 losing material (e.g. copper), which is released to the cleaning solution 209 and or deposited on other traces or portions of the circuit board 200. This is generally known as etching.

As shown in FIG. 2, the exposed trace portion 210 should have a height approximately the same as the contact finger trace 204 along the top edge 212 of the substrate 208. For example, the contact finger trace 204 has a height H1. However, due to the etching caused by the galvanic voltage difference, a substantial portion of the exposed trace portion 210 has been etched away, resulting in the exposed trace portion 210 having a reduced height H2. In one embodiment, the etching may have resulted in a 75% loss of material from the exposed trace portion 210. However, losses of more than 75% or less than 75% may also occur based on the types of material used, and the generated Galvanic voltage differential. This can result in the exposed trace portion 210 weakening, particularly when a component is soldered between the exposed trace portion 210 and another trace, such as trace 214, on the circuit board 200. Additionally, the reduced quantity of material on the exposed trace portion 210 may increase the resistance within the contact finger trace 204, resulting in additional heating of the contact finger trace 204 and/or connected components.

Figure 3:
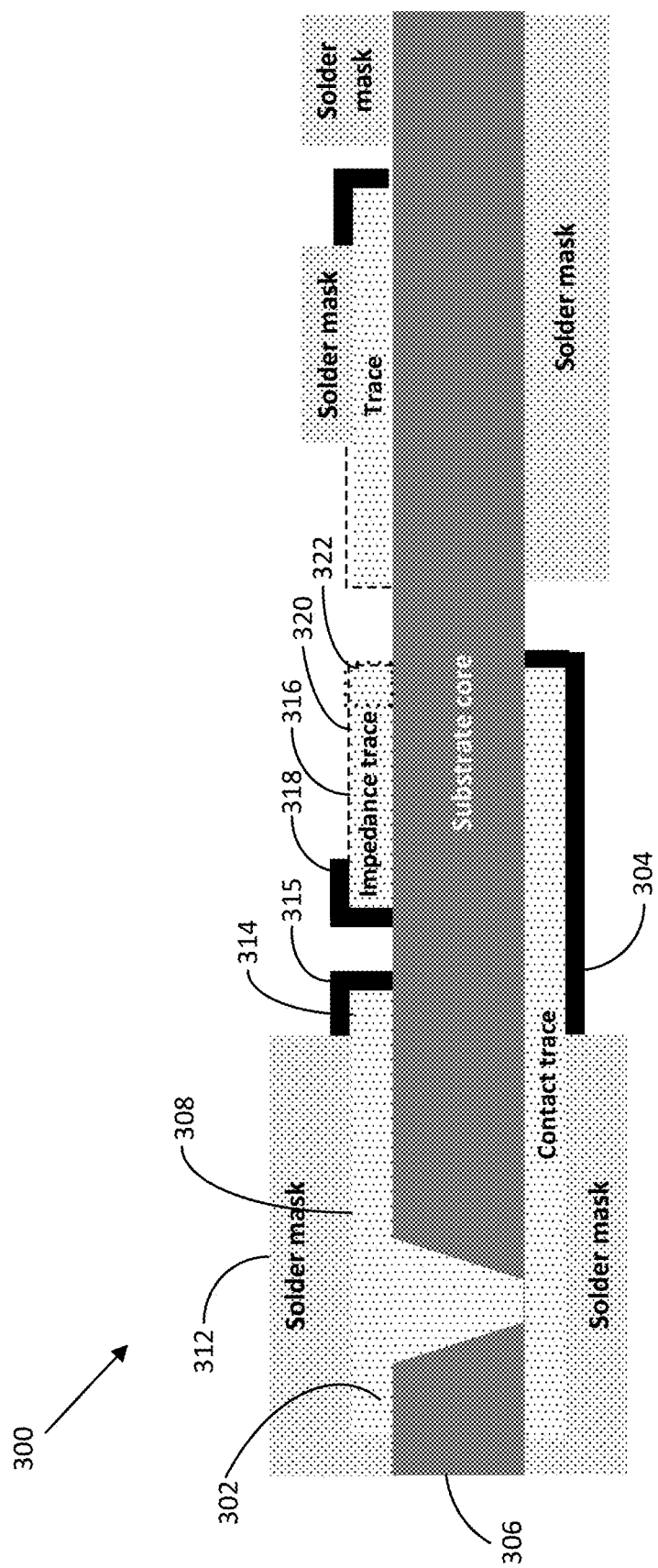
FIG. 3 is a cross-sectional view of a substrate used in a data storage device with galvanic etching reduction features, according to some embodiments.

Turning to FIG. 3, a cross-sectional area of a modified circuit board 300 is shown that is configured to reduce the effect of etching due to the galvanic effect. Similar to the circuit board 200, the circuit board 300 includes a contact finger trace 302, a contact finger area 304 coupled to the contact finger trace 302, and a substrate 306. As described above, the contact finger trace 302 may be constructed of copper and the contact finger area 304 may be constructed of gold, or other suitable material, such as nickel-gold. A first portion 308 of the contact finger trace 302 on a first side 310 of the substrate 306 is substantially covered by solder mask 312. A second portion 314 of the contact finger trace 302 is not covered by the solder mask 312. The second portion 314 is plated with the same material as the contact finger area 304, such as gold, to form a first pad 315. As the second portion 314 of the contact finger trace 302 is plated in the same material as the contact finger area 304, there is no etching, as there is no galvanic voltage difference between second portion 314 of the contact finger trace 302 and the contact finger area 304. Further, as the second portion 314 is electrically isolated from other traces, etching due to galvanic effect is reduced.

An impedance trace 316 formed from a different material than the contact finger area 304, such as copper, is shown in FIG. 3. The impedance trace 316 includes a plated portion forming a second pad 318 and a non-plated portion 320. The second pad 318 is plated with the same material as the second portion 314 of the contact finger trace 302 and is used to provide a connection to the second portion 314 of the contact finger trace 302. The impedance trace 316 also provides a connection from the contact finger area 304 to one or more components on the circuit board 300. The non-plated portion 320 of the impedance trace 316 is generally coupled to an electrical component of the data storage device 102, such as a memory die, a controller, or other components associated with the memory storage device. The non-plated portion 320 may further include a bump pad area 322 for connections to other traces or components.

Upon the circuit board 300 being subject to a cleaning solution as described above, there is no etching of the contact finger trace 302, as all exposed portions of the contact finger trace 302 are plated in the same material as the contact finger area 304. Additionally, there is no electrical connection between the contact finger trace 302 and other traces, such as the impedance trace 316 during the cleaning process. This further prevents any etching due to the galvanic effect. The impedance trace 316 may experience slight etching due to the second pad 318 being made of a different material than the non-plated portion 320 of the impedance trace 316. However, as the second pad 318 has a substantially smaller surface area than the non-plated portion 320 there is less etching due to a smaller galvanic voltage being generated due to the plated portion of the second pad 318. In one example, the second pad 318 has a surface area approximately 75% smaller than the non-plated portion 320. However, values of more than 75% or less than 75% are also contemplated.

As described above, a connection between the first pad 315 of the contact finger trace 302 and the second pad 318 of the impedance trace 316 is required to connect the contact finger area 304 to components within the data storage device 102. To avoid etching due to galvanic voltage generation, the connection between the first pad 315 and the second pad 318 is performed after a cleaning and a subsequent OSP process has been performed. As described in more detail below, there are various configurations that may be used to provide the connection between the first pad 315 and the second pad 318.

Figure 4:
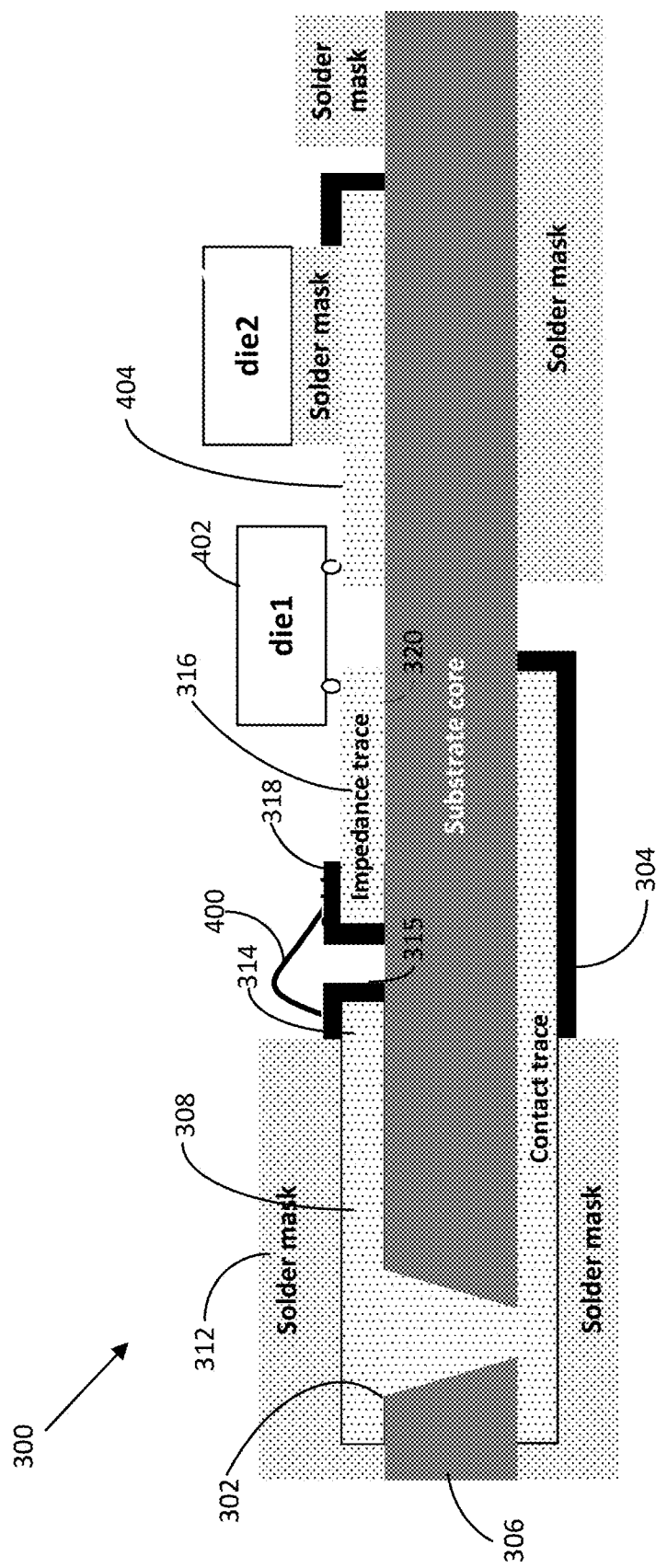
FIG. 4 is a cross-sectional view of the substrate of FIG. 3 illustrating a wire connection configuration, according to some embodiments.

Turning now to FIG. 4, the circuit board 300 of FIG. 3 is shown during a subsequent stage of fabrication where a connection is made between the first pad 315 and the second pad 318. As shown in FIG. 4, a wire 400 is bonded between the first pad 315 and the second pad 318 to provide an electrical connection. In one embodiment, the wire 400 is a gold wire. However, other wire types are also contemplated as applicable for a given application. As further shown in FIG. 4, a die 402 is shown coupled between the impedance trace 316 and a component trace 404 illustrating that various components are coupled to the contact finger area 306 using the impedance trace 316. In one embodiment, the die 402 is a memory die, such as a NAND die. In other embodiments, the die 402 may be a controller, or other components associated with the data storage device 102.

Figure 5:
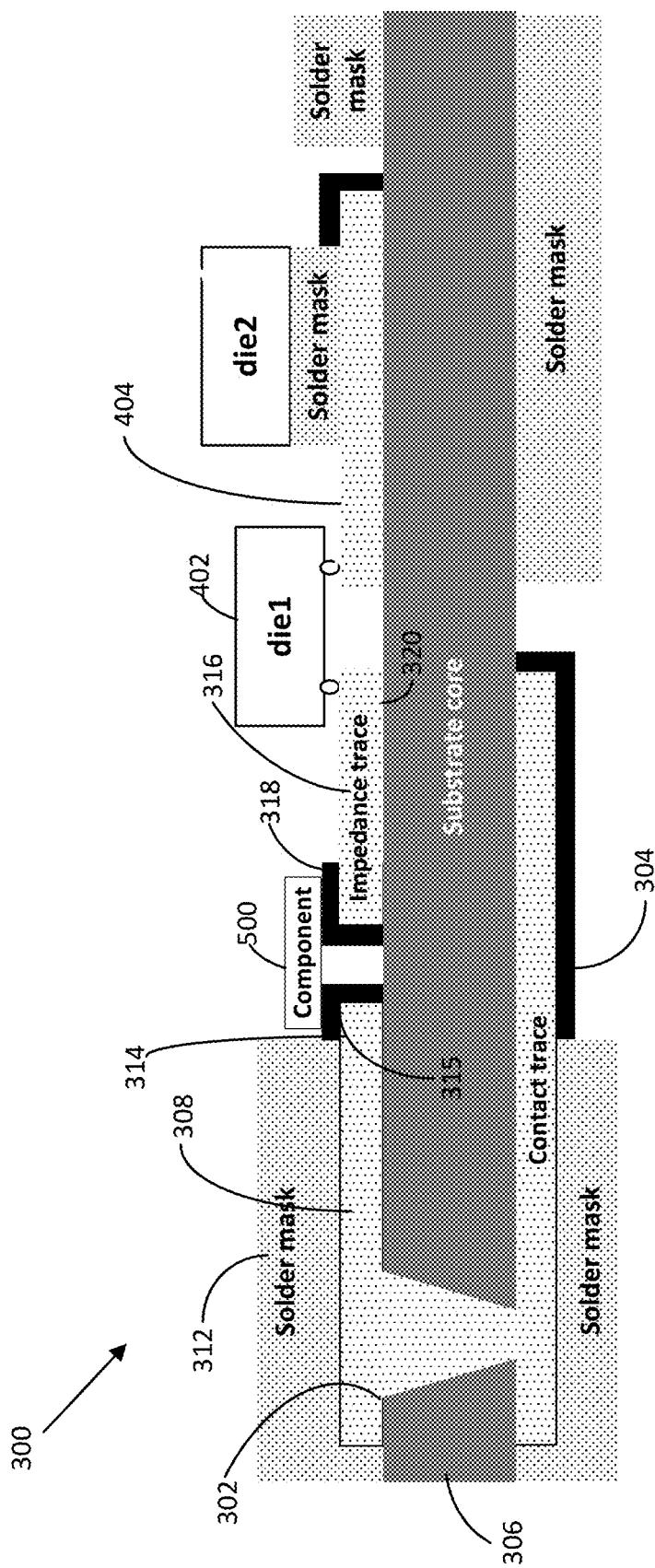
FIG. 5 is a cross-sectional view of the substrate of FIG. 3, illustrating a component connection configuration, according to some embodiments.

Turning now to FIG. 5, the circuit board 300 of FIG. 3 is shown having a component 500 providing the connection between the first pad 315 and the second pad 318. The component 500 is generally a surface mount (SMT) component with a physical size selected based on various factors, such as the pitch between the first pad 315 and the second pad 318. The component 500 may be soldered or otherwise physically coupled to the first pad 315 and the second pad 318. In one embodiment, the component 500 is a resistor, such as a zero-ohm resistor. In some embodiments, the component 500 is a resistor having a resistance value less than fifty ohms. In other embodiments, the component 500 is a capacitor. In some examples, the capacitor may have a value of 0.1 microfarads, however other capacitor values are contemplated. For example the capacitor may have a value based on an operating frequency of the associated data storage device.

Figure 6:
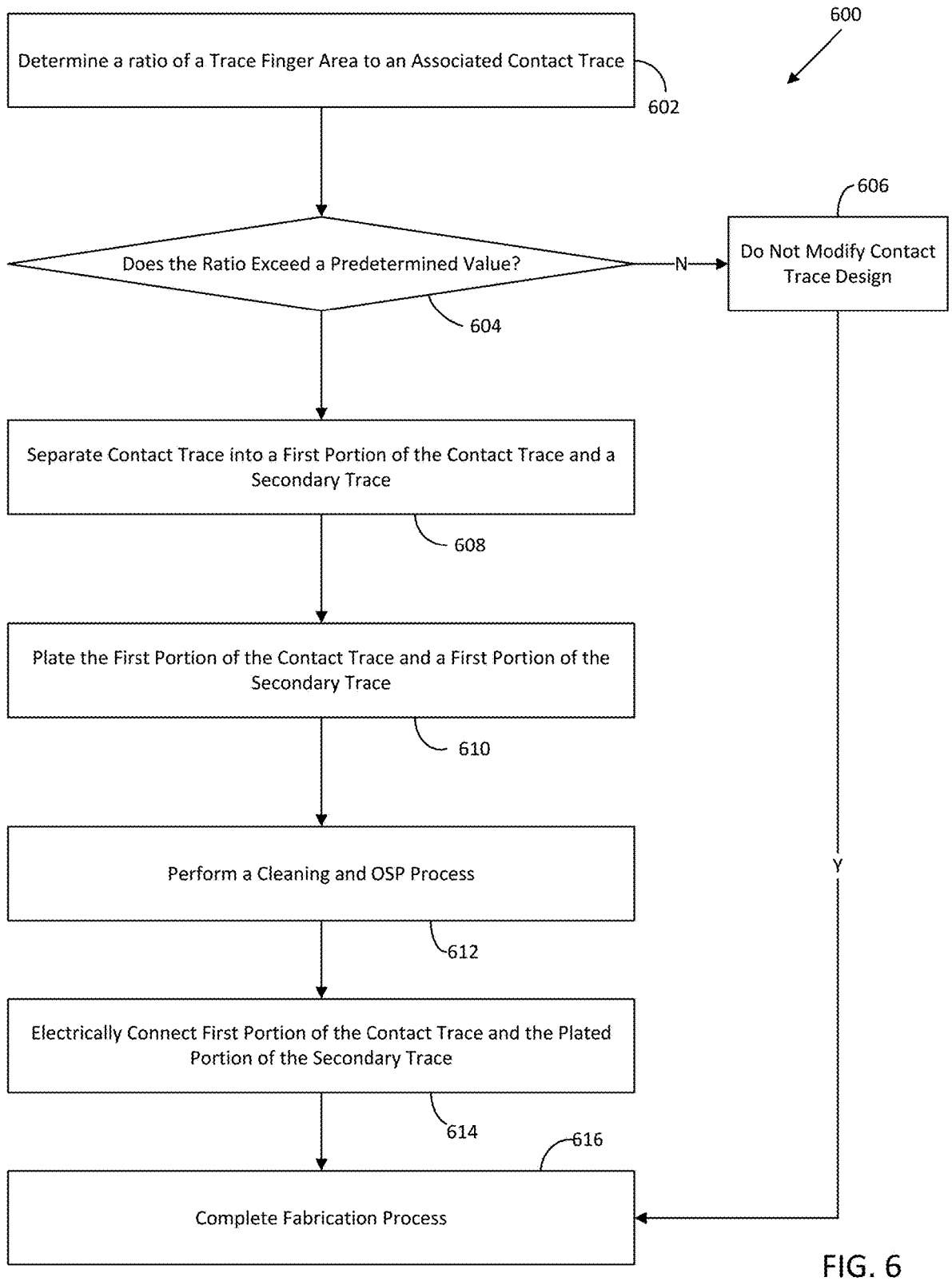
FIG. 6 is a flowchart illustrating a process for reducing etching on a contact trace coupled to a contact finger due to galvanic voltages on a substrate, according to some embodiments.

Turning now to FIG. 6, a process 600 for reducing etching on a contact trace coupled to a contact finger or other external device connection point on a data storage device due to galvanic effect is described, according to some embodiments. The process 600 is described with reference to the circuit board 300 and data storage device 102 described above, but it is contemplated that the process 600 is applicable for any data storage device having contact fingers constructed of a different material than an internal contact trace electrically coupled to the contact fingers. The process 600 may be performed by one or more electronic processors or computing devices executing software or other computer implemented instructions for performing the following functions.

At block 602, a ratio of the surface area of a contact finger, such as contact finger 304, to the surface area of an exposed contact trace, such as exposed portion 314, in electrical connection with a contact finger trace, such as contact finger trace 302, of the data storage device is calculated. In one embodiment, the exposed contact trace is the portion of a contact trace that is not encapsulated by solder mask and exposed without any plating or coating. The contact finger is the plated portion of the contact trace that is configured to interface with a host device and is plated with a different material than the contact trace. In some embodiments, a galvanic voltage may be calculated based on the ratio of the surface area and materials of the contact finger to the surface area of the exposed contact trace.

At block 604, a determination as to whether the calculated ratio exceeds a predetermined value is determined. In some embodiments, the predetermined value may be a twenty to one ratio. However, ratios of more than twenty to one, or less than twenty to one are also contemplated. In some examples, the predetermined value ratio may be fifteen to one ratio. The predetermined value may vary based on the types of material associated with the contact finger and the exposed contact trace. In some embodiments, a determination as to whether the calculated galvanic voltage, based at least in part on the calculated ratio and the materials of the contact finger and the exposed contact trace, exceeds a predetermined value is made. For example, a predetermined galvanic voltage value may be 0.3V. However, values of more than 0.3V or less than 0.3V. In some examples, the predetermined galvanic voltage level may be determined based on an expected amount of etching resulting from the galvanic voltage level exceeding a desired amount.

In response to determining that the ratio does not exceed a predetermined value, the contact trace is not modified at block 606. In response to determining that the ratio does exceed a predetermined value, the exposed contact trace is separated into a modified exposed contact trace, such as exposed portion 314, and a separate impedance trace, such as impedance trace 316, at block 608. The modified exposed contact trace may be substantially smaller (e.g. have less surface area) than the unmodified exposed contact trace. For example, the modified exposed contact trace may have approximately 20% of the surface area of the unmodified exposed contact trace. However, in other embodiments, values or more than 20% or less than 20% are also contemplated.

At block 610, the modified exposed contact trace and a first portion of the impedance trace are plated with the same material as the contact finger to form pads, such as first pad 315 and second pad 318, described above. In some examples, the modified exposed contact trace and the first portion of the impedance trace are plated at the same time, and with the same material, as the contact finger. In one embodiment, the first pad 315 is approximately the same size (e.g. has the same surface area) as the second pad 318. In other embodiments, the first pad 315 is sized to allow for a connection to be made between the first pad 315 and the second pad 318, as described in more detail below. In one embodiment, the plating material is gold. In other embodiments, the plating material is a nickel-gold compound. Other plating materials are contemplated as appropriate for a given application. By plating the modified exposed contact trace with the same material as the contact finger, etching of the first pad 315 due to Galvanic effect is reduced or eliminated. The ratio of different exposed materials on the contact finger and contact trace may be as low as 0.3:1. However, other ratios are contemplated. Further, the ratio of different exposed materials between the first pad 315 and the second pad 318 may be as low as 0.3:1.

At block 612 a cleaning and pre-soldering process is performed, such as described above. For example, a cleaning solution may first be applied to the data storage device to remove any organic materials, and an OSP process may then be performed to prevent contamination to the traces and other connections on the data storage device.

At block 614, a connection is made between the first pad 315 and the second pad 318. In one embodiment, the connection is made by bonding a wire between the first pad 315 and the second pad 318. The wire may be a gold wire. In other embodiments, the wire is made of the same material as the plating applied to the first pad 315 and the second pad 318. In some embodiments, the connection is made by coupling a component between the modified exposed contact trace and the first portion of the impedance trace. In one example, the component is a zero-ohm resistor. In other embodiments, the component is a capacitor. The components may be surface mount device. In some examples, the physical size and package of the component is selected based on the size of the first pad 315 and the second pad 318, as well as a distance between the two.

After the connections between the modified exposed contact trace and the first portion of the impedance trace is completed, any remaining fabrication processes are performed at block 616. The remaining fabrication processes may include component placement, soldering, and application of a molding material to encapsulate the components of the data storage device.

Figure 7:
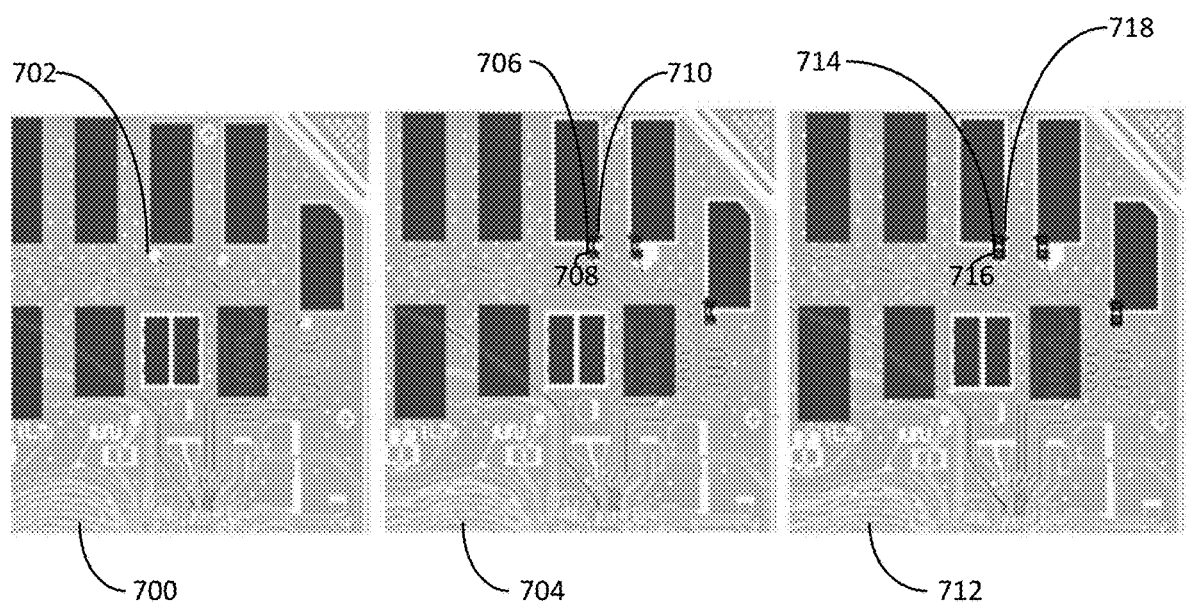
FIG. 7 is a partial substrate layout of a data storage device, according to some embodiments.

Turning now to FIG. 7, a partial substrate circuit layout of a data storage device, such as those described above, using different connection types to couple to one or more contract finger areas is shown, according to some embodiments. The layout 700 illustrates a conventional substrate layout (as shown in FIG. 2), where the connections to the contact finger areas are coupled directly via a contact trace 702. The layout 704 illustrates a modified substrate layout (as shown in FIG. 3), where the connections to the contact finger areas are facilitated by using a wire jumper 706 to provide an electrical connection between a contact trace 708 and an impedance trace 710, similar to that shown in FIG. 4. The layout 712 illustrates a modified substrate layout (as shown in FIG. 3), where the connection to the contact finger areas are facilitated by using a component 714 to provide an electrical connection between a contact trace 716 and an impedance trace 718, similar to that shown in FIG. 5.

Figure 8A:
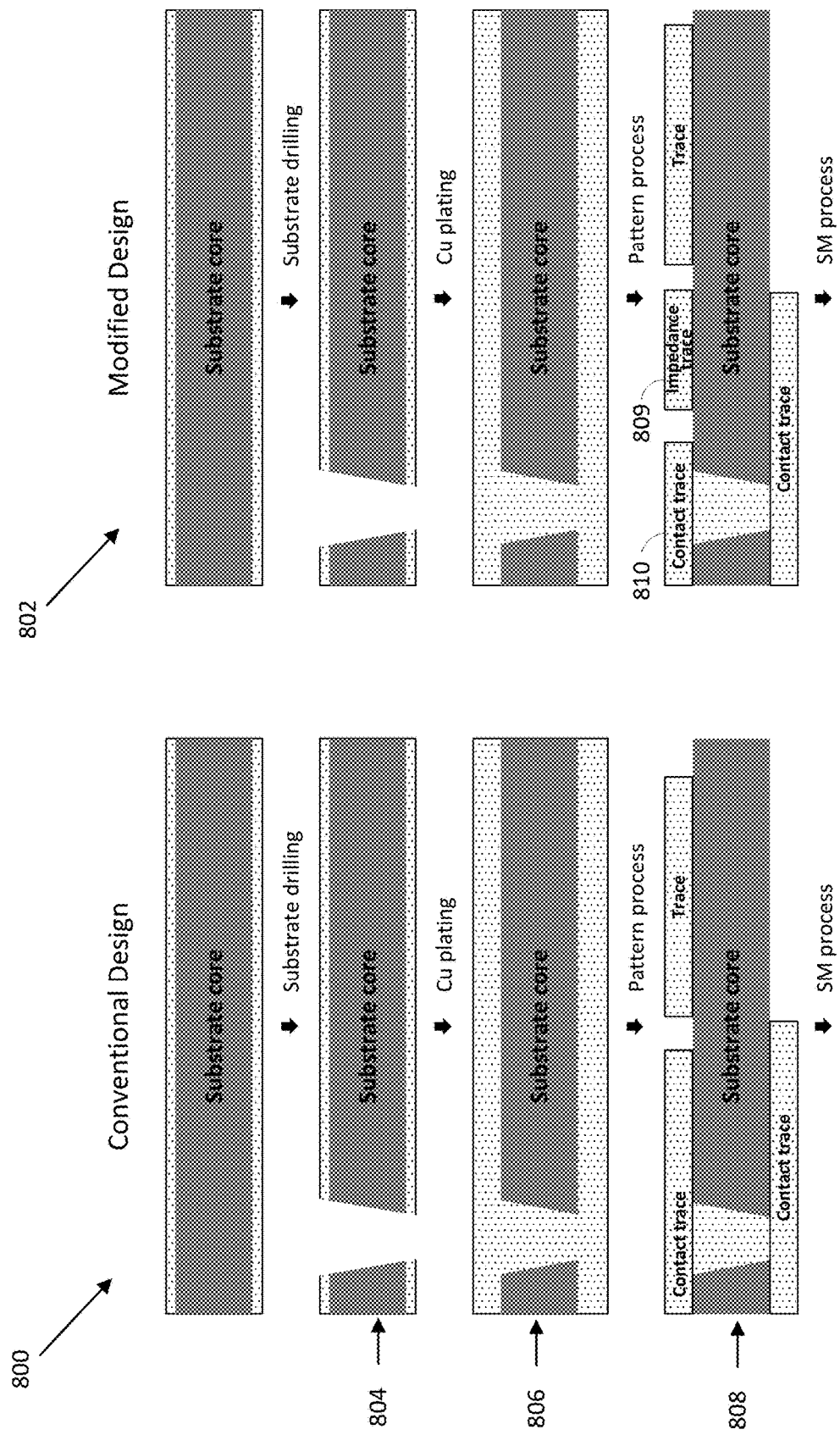
FIGS. 8A-8C is a fabrication process for a substrate, according to some embodiments.
Figure 8B:
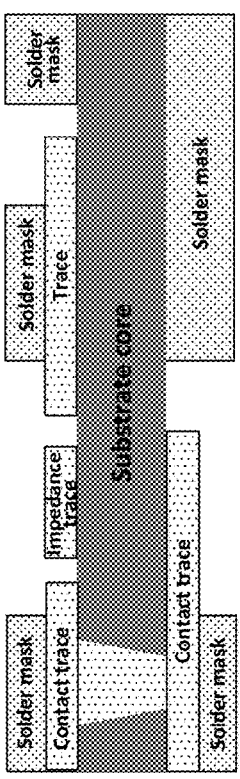
Figure 8B:
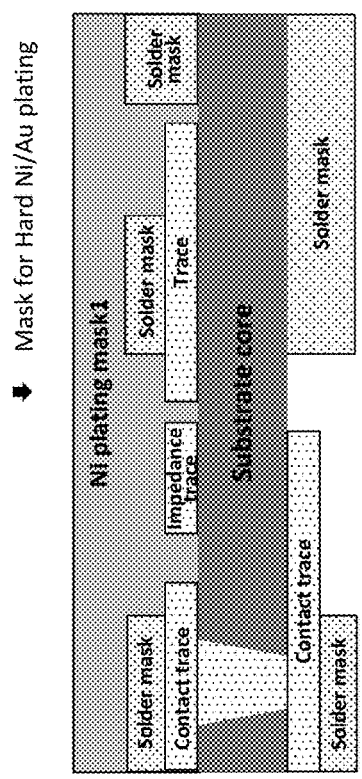
Figure 8B:
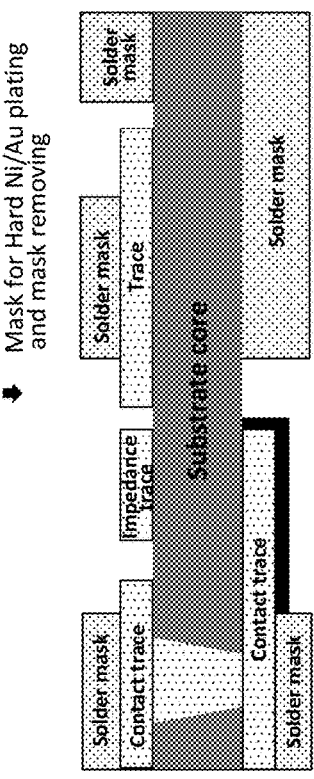
Figure 8B:
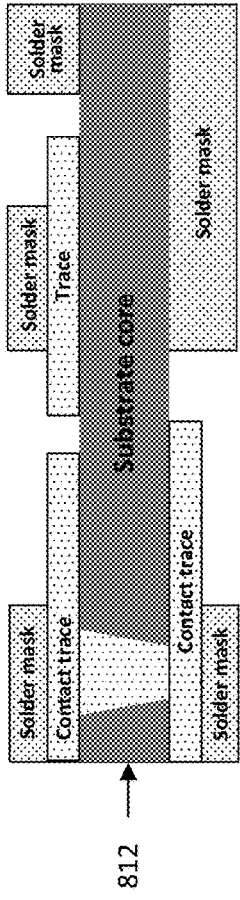
Figure 8B:
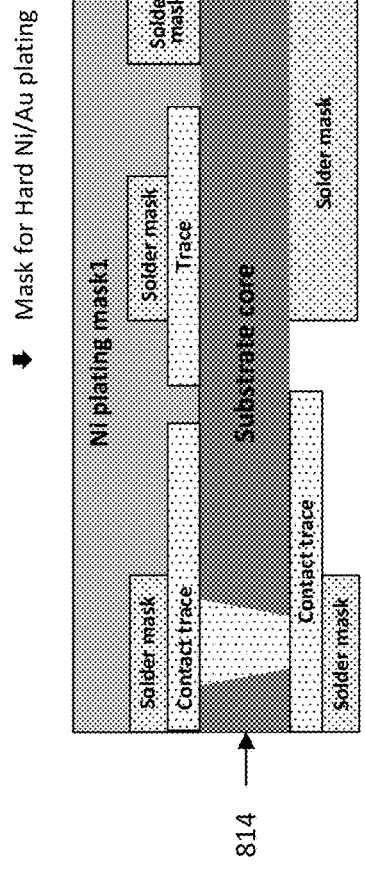
Figure 8B:
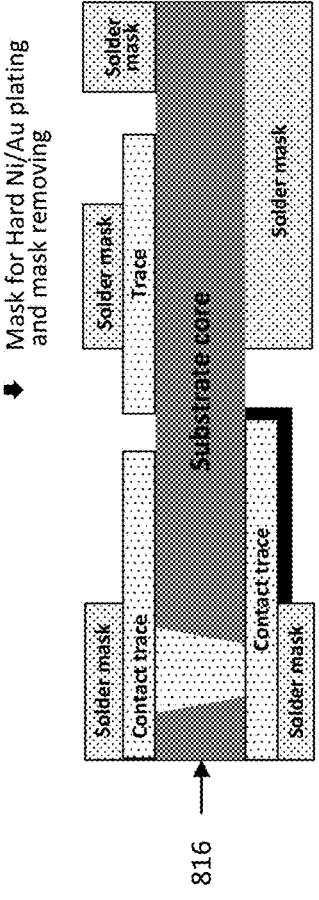
Figure 8C:
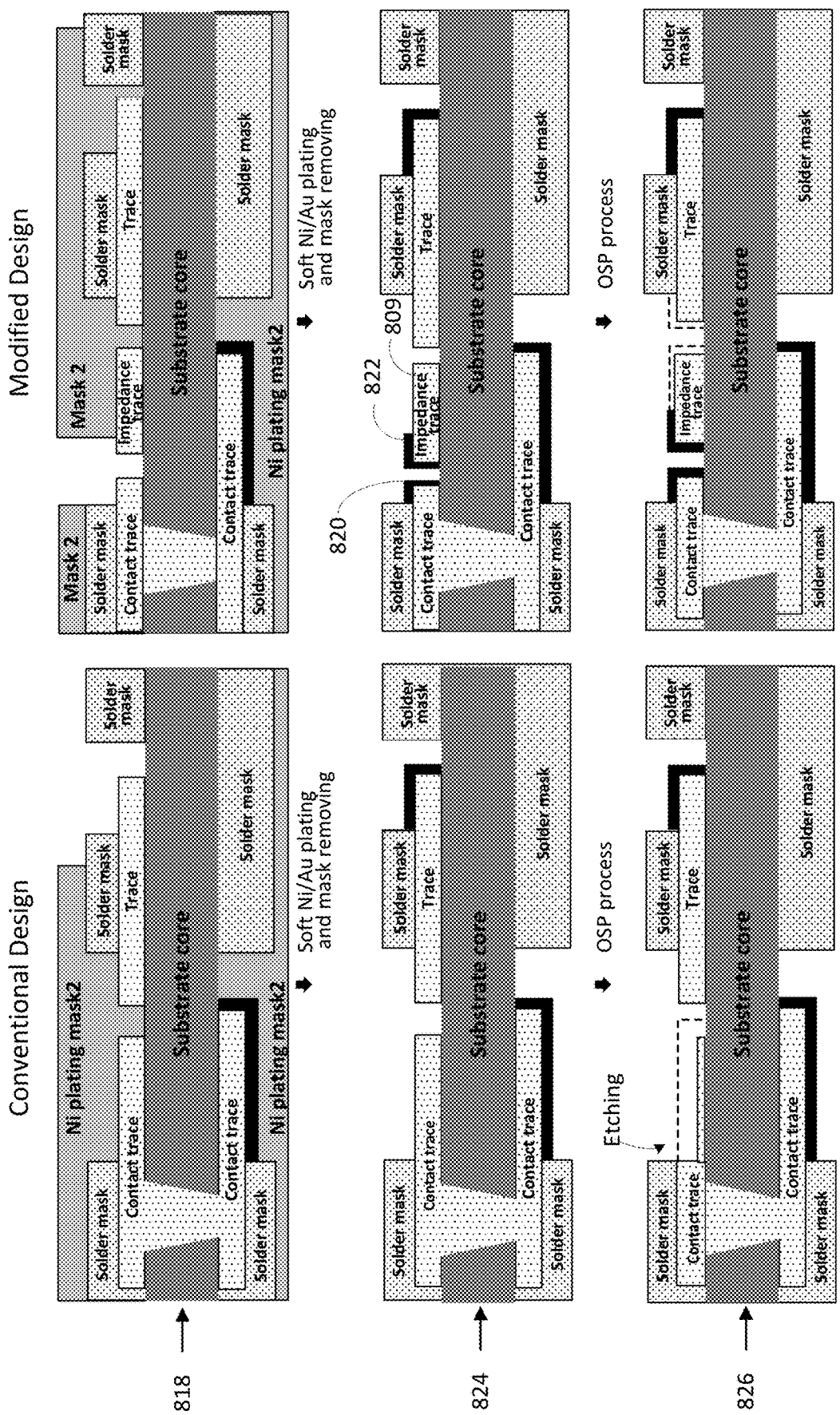

FIGS. 8A-8C illustrate a manufacturing process of a data storage device, such as data storage device 102, described above, using both a convention design 800 (for example, the design of FIG. 2) and a modified design 802 to reduce galvanic effect on contact traces during fabrication (for example, the design of FIG. 3). With respect to FIG. 8A, both the conventional design 800 and the modified design 802 begin with a substrate core. In both designs 800, 802, a substrate drilling operation 804 and copper plating operation 806 is performed in an identical manner. During a patterning process 808, an impedance trace 809 is patterned separated from a contact finger trace 810 in the modified design 802, as described above.

With respect to FIG. 8B, a solder mask process 812 is applied to both designs 800, 802. Similarly, a mask for hard nickel-gold ("Ni/Au") plating is applied identically for both designs 800, 802 during masking process 814. Hard Ni/Au is applied at plating process 816 to plate at least a portion of the contact finger area, and the mask is then removed for both designs 800, 802.

With respect to FIG. 8C, a soft Ni/Au masking process 818 applies a soft Ni/Au mask to both designs 800, 802. However, for the modified design 802, the soft Ni/Au mask is applied to allow for soft Ni/Au plating on the contact finger trace 810 to create a first pad 820 and to create a second pad 822 on the impedance trace 809 during soft Ni/Au plating process 824. An OSP process 826, as described above, is then applied to the designs 800, 802. The original design 800, as shown in the OSP process 826, experiences etching due to the galvanic effect on the contact trace coupled to the contact finger area, as described in detail above. However, in the modified design 802, the contact trace does not experience etching due to galvanic effect as the first pad 820 having the same material as the contact finger area, here Ni/Au plating. Some minor etching may occur on the impedance trace 809 due to the second pad 822, but this etching will be minor due to the relatively small surface area of Ni/Au associated with the second pad 822.

Upon fabrication of the substrates, further fabrication processes may be performed, such as component placement, soldering, and molding. For example, during a component placement process, a wire or component may be placed between the first pad 820 and the second pad 822, such as described above in FIGS. 4 and 5, above.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A printed circuit board for an electronic device, comprising:
    a substrate having a first side and a second side opposite to the first side;
    a contact finger disposed on the first side of the substrate configured to interface with an external electronic device;
    a contact trace coupled to the contact finger and extending from the first side of the substrate to the second side of the substrate, wherein the contact trace has an exposed portion disposed on the second side of the substrate; and
    an impedance trace disposed on the second side of the substrate and configured to be coupled to one or more components of the electronic device;
    wherein the contact finger and the exposed portion of the contact trace are plated with a common material to reduce galvanic etching of the contact trace; and
    wherein the exposed portion of the contact trace is electrically connected to the impedance trace by way of at least one of a component and a bond wire.

2. The printed circuit board of claim 1, wherein the exposed portion of the contact trace is electrically connected to the impedance trace with a bond wire.

3. The printed circuit board of claim 1, wherein the component is a resistor.

4. The printed circuit board of claim 1, wherein the component is a capacitor.

5. The printed circuit board of claim 1, wherein the surface area of the contact finger is up to twenty times larger than the exposed portion of the contact trace.

6. The printed circuit board of claim 1, wherein the common material is gold.

7. The printed circuit board of claim 1, wherein the common material is nickel-gold.

8. The printed circuit board of claim 1, wherein the impedance trace includes a plated portion plated with the common material, and wherein the plated portion of the impedance trace is coupled to the component.

9. A method for reducing etching due to galvanic effect in a printed circuit board, the method comprising:
    determining a ratio of a surface area of a contact finger to a surface area of an exposed portion of a contact trace electrically connected to the contact finger, wherein the contact finger is configured to provide an electrical connection to an external electronic device;
    determining whether the ratio exceeds a predetermined threshold;
    responsive to determining that the ratio exceeds the predetermined threshold, separating the exposed portion of the contact trace into a contact trace portion and an impedance trace, wherein the contact trace portion and the impedance trace are electrically isolated;
    plating the contact finger and the contact trace portion with a common material; and
    electrically connecting the contact trace portion and the impedance trace with one of a component or a bond wire.

10. The method of claim 9, wherein the contact trace portion and the impedance trace are electrically connected with the bond wire.

11. The method of claim 9, wherein the component is a resistor having a resistance value of less than fifty ohms.

12. The method of claim 9, wherein the component is a capacitor.

13. The method of claim 9, wherein the common material is gold.

14. The method of claim 9, further comprising plating a first portion of the impedance trace with the common material.

15. A card-type data storage device, comprising:
    a substrate having a first side and a second side opposite to the first side;
    a contact finger disposed on the first side of the substrate configured to interface with a host device and plated with a plating material;
    a first trace coupled to the first contact finger and extending from the first side of the substrate to the second side of the substrate, wherein the first trace has an exposed portion disposed on the second side of the substrate, the exposed portion being plated with the plating material; and
    a second trace disposed on the second side of the substrate, wherein a portion of the second trace is plated with the plating material; and wherein the exposed portion of the first contact trace is electrically connected to the second trace through a connection device, the connection device connected between the plated portion of the first trace and the plated portion of the second trace.

16. The card-type data storage device of claim 15, wherein the connection device is a bond wire.

17. The card-type data storage device of claim 15, wherein the connection device is a resistor.

18. The card-type data storage device of claim 15, wherein the connection device is a capacitor.

19. The card-type data storage device of claim 15, wherein the surface area of the contact finger is up to twenty times larger than the exposed portion of the first trace.

20. The card-type data storage device of claim 15, wherein the plating material is at least one of gold or nickel-gold.

* * * * *